(12) United States Patent
Hyun et al.

(10) Patent No.: US 10,446,199 B2
(45) Date of Patent: Oct. 15, 2019

(54) SEMICONDUCTOR DEVICE AND SEMICONDUCTOR SYSTEM

(71) Applicant: SK hynix Inc., Icheon-si Gyeonggi-do (KR)

(72) Inventors: Sang Ah Hyun, Chungju-si (KR); Yunyoung Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/684,228

(22) Filed: Aug. 23, 2017

(65) Prior Publication Data
US 2018/0261268 A1 Sep. 13, 2018

(30) Foreign Application Priority Data
Mar. 7, 2017 (KR) .................. 10-2017-0028640

(51) Int. Cl.
| | |
|---|---|
| G11C 7/10 | (2006.01) |
| G11C 8/08 | (2006.01) |
| G11C 11/406 | (2006.01) |
| G11C 7/02 | (2006.01) |

(52) U.S. Cl.
CPC .......... G11C 7/1087 (2013.01); G11C 8/08 (2013.01); G11C 11/40603 (2013.01); G11C 11/40611 (2013.01); G11C 11/40618 (2013.01); G11C 7/02 (2013.01)

(58) Field of Classification Search
CPC .............................. G11C 7/1087; G11C 8/08
See application file for complete search history.

(56) References Cited

U.S. PATENT DOCUMENTS

| | | | |
|---|---|---|---|
| 9,311,984 B1* | 4/2016 | Hong | G11C 11/406 |
| 9,472,260 B1* | 10/2016 | Kim | G11C 11/40618 |
| 2008/0253212 A1 | 10/2008 | Iida et al. | |
| 2014/0369109 A1* | 12/2014 | Lee | G11C 11/406 365/149 |
| 2015/0255140 A1* | 9/2015 | Song | G11C 11/406 365/222 |
| 2016/0042782 A1* | 2/2016 | Narui | G11C 11/40611 365/222 |
| 2016/0111140 A1* | 4/2016 | Joo | G11C 11/40611 365/222 |
| 2016/0163372 A1* | 6/2016 | Lee | G11C 11/406 365/222 |
| 2016/0293243 A1* | 10/2016 | Joo | G11C 29/783 |

FOREIGN PATENT DOCUMENTS

KR 1020150105054 A 9/2015

* cited by examiner

*Primary Examiner* — Tri M Hoang
(74) *Attorney, Agent, or Firm* — William Park & Associates Ltd.

(57) ABSTRACT

A semiconductor device may include a latch circuit configured for storing a row address including information on a position where a smart refresh operation has been performed, as a storage address. The semiconductor device may include a refresh control circuit configured for controlling, depending on a result of comparing a row address inputted from an exterior and the storage address, a smart refresh operation to be performed for the row address, and omitting the smart refresh operation based on the row address and the storage address being the same combination.

23 Claims, 12 Drawing Sheets

SEMICONDUCTOR DEVICE AND SEMICONDUCTOR SYSTEM

CROSS-REFERENCE TO RELATED APPLICATION

The present application claims priority under 35 U.S.C. § 119(a) to Korean Patent Application No. 10-2017-0028640 filed on Mar. 7, 2017 in the Korean Intellectual Property Office, which is incorporated herein by reference in its entirety.

BACKGROUND

1. Technical Field

Embodiments of the present disclosure may generally relate to a semiconductor device configured to perform a smart refresh operation.

2. Related Art

A semiconductor device consists of a plurality of memory cells for storing data. Each of the memory cells is constructed by a cell capacitor and a cell transistor. The semiconductor device stores data through an operation of charging or discharging charges to or from the cell capacitor, and ideally the amount of charges stored in the cell capacitor should be always constant. However, the amount of charges stored in the cell capacitor varies due to a voltage difference from a peripheral circuit. A variation in the amount of charges stored in the cell capacitor means that the data stored in the cell capacitor is changed, and this means loss of stored data. A semiconductor device may perform a refresh operation to prevent a data loss associated with this type of phenomenon.

As processing technologies are developed, the degree of integration of a semiconductor device gradually increases. As a consequence, the gap between memory cells is decreasing, and the gap between word lines coupled to the memory cells is decreasing. If the gap between word lines decreases, as an interference effect occurs between adjacent word lines, it may be difficult to retain the data stored in the memory cells coupled to the corresponding word lines. That is to say, as a result, the probability of data to be lost increases.

Recently, in a semiconductor device, in consideration of an interference effect between word lines, by performing an additional refresh operation for adjacent word lines adjacent to a target word line on which accesses are concentrated, it is possible to prevent the data of the memory cells coupled to the adjacent word lines from being lost due to the interference effect between the word lines. Performing a refresh for adjacent word lines when a target word line is activated is referred to as smart refresh.

SUMMARY

In an embodiment, a semiconductor device may be provided. The semiconductor device may include a latch circuit configured for storing a row address including information on a position where a smart refresh operation has been performed, as a storage address. The semiconductor device may include a refresh control circuit configured for controlling, depending on a result of comparing a row address inputted from an exterior and the storage address, a smart refresh operation to be performed for the row address, and omitting the smart refresh operation based on the row address and the storage address being the same combination.

In an embodiment, a semiconductor device may be provided. The semiconductor device may include a latch control circuit configured for generating an input control signal, an output control signal and a latch control signal which are selectively enabled depending on a bank address, based on an active signal. The semiconductor device may include a latch circuit configured for storing a row address as a storage address based on the input control signal, the output control signal and the latch control signal. The semiconductor device may include a refresh control circuit configured for controlling, depending on a result of comparing a row address inputted from an exterior and the storage address, a smart refresh operation to be performed for the row address, and omitting the smart refresh operation based on the row address and the storage address being the same combination.

DETAILED DESCRIPTION

Hereinafter, a semiconductor device and a semiconductor system will be described below with reference to the accompanying drawings through various examples of embodiments. Further, the logic levels of the signals may be different from or the opposite of those described. For example, a signal described as having a logic "high" level may alternatively have a logic "low" level, and a signal described as having a logic "low" level may alternatively have a logic "high" level. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to a semiconductor device capable of storing a row address for which smart refresh has been performed and omitting a smart refresh operation in the case where the stored row address and a row address inputted from an exterior are the same combination.

According to the embodiments, by storing a row address for which a smart refresh has been performed and omitting a smart refresh operation in the case where the stored row address and a row address inputted from an exterior are the same combination, a current consumption amount may be reduced.

Figure 1:
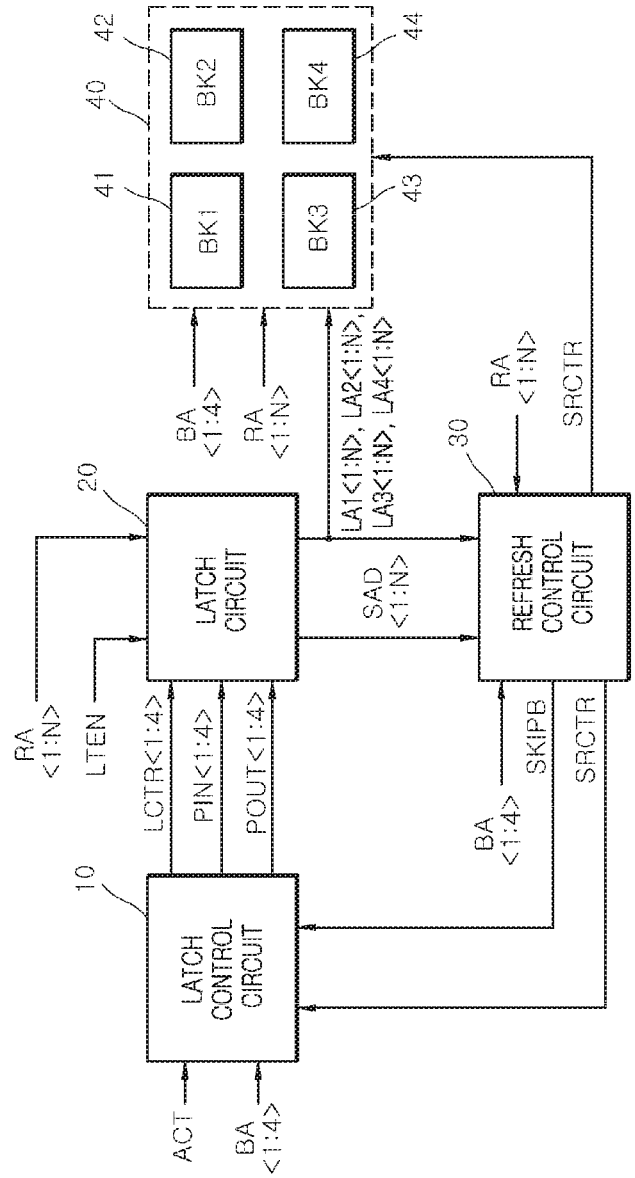
FIG. 1 is a block diagram illustrating a representation of an example of the configuration of a semiconductor device in accordance with an embodiment.

Referring to FIG. 1, a semiconductor device in accordance with an embodiment may include a latch control circuit 10, a latch circuit 20, a refresh control circuit 30, and a memory circuit 40.

The latch control circuit 10 may generate first to fourth input control signals PIN<1:4>, first to fourth output control signals POUT<1:4> and first to fourth latch control signals LCTR<1:4> which are enabled selectively depending on bank addresses BA<1:4>, in response to an active signal ACT, a skip signal SKIPB and a refresh control signal SRCTR. The latch control circuit 10 may generate the first to fourth latch control signals LCTR<1:4> which are enabled selectively depending on the bank addresses BA<1:4>, in response to the active signal ACT. The latch control circuit 10 may generate the first to fourth input control signals PIN<1:4> which are enabled selectively depending on the first to fourth latch control signals LCTR<1:4>, in the case where the skip signal SKIPB is disabled. The latch control circuit 10 may generate the first to fourth input control signals PIN<1:4> which are disabled, in the case where the skip signal SKIPB is enabled. The latch control circuit 10 may generate the first to fourth output control signals POUT<1:4> which are enabled selectively depending on the bank addresses BA<1:4>, in the case where the refresh control signal SRCTR is enabled. The latch control circuit 10 may generate the first to fourth output control signals POUT<1:4> which are disabled, in the case where the refresh control signal SRCTR is disabled. The bank addresses BA<1:4> may be set as addresses for selecting first to fourth banks 41, 42, 43 and 44 which are included in the memory circuit 40. The active signal ACT as a signal for activating the word lines included in the first to fourth banks 41, 42, 43 and 44 may be set as a signal which is enabled in an active operation, a refresh operation and a smart refresh operation.

The latch circuit 20 may output row addresses RA<1:N> which include the information of a position where a smart refresh operation has been performed, as storage addresses SAD<1:N>, in response to a latch enable signal LTEN, the first to fourth input control signals PIN<1:4>, the first to fourth output control signals POUT<1:4> and the first to fourth latch control signals LCTR<1:4>. The latch circuit 20 may output the row addresses RA<1:N> as the storage addresses SAD<1:N> in response to the latch enable signal LTEN, the first to fourth input control signals PIN<1:4>, the first to fourth output control signals POUT<1:4> and the first to fourth latch control signals LCTR<1:4>. The latch circuit 20 may output the row addresses RA<1:N> which include the information of a position for performing a smart refresh operation, as first to fourth latch addresses LA1<1:N>, LA2<1:N>, LA3<1:N> and LA4<1:N>, in response to the first to fourth input control signals PIN<1:4>. The latch circuit 20 may update the first to fourth latch addresses LA1<1:N>, LA2<1:N>, LA3<1:N> and LA4<1:N> for a smart refresh operation, as internal addresses IAD<1:N> (see FIG. 3), in response to the first to fourth output control signals POUT<1:4>. The latch circuit 20 may output the internal addresses IAD<1:N> as the storage addresses SAD<1:N> in response to the first to fourth input control signals PIN<1:4>, the first to fourth latch control signals LCTR<1:4> and the first to fourth output control signals POUT<1:4>. The row addresses RA<1:N> may be set as addresses for selecting the word lines included in the first to fourth banks 41, 42, 43 and 44. The number of bits of the row addresses RA<1:N> may be set to various numbers of bits depending on the number of word lines included in the first to fourth banks 41, 42, 43 and 44. The latch enable signal LTEN may be set as a signal which is enabled to logic high level in the case where the skip signal SKIPB is disabled to a logic high level.

The refresh control circuit 30 may compare the row addresses RA<1:N> inputted from an exterior and the storage addresses SAD<1:N>, and control a smart refresh operation for the row addresses RA<1:N>. The refresh control circuit 30 may omit a smart refresh operation for the row addresses RA<1:N> in the case where the row addresses RA<1:N> and the storage addresses SAD<1:N> are the same combination. The refresh control circuit 30 may generate the skip signal SKIPB which is enabled, in the case where the row addresses RA<1:N> and the storage addresses SAD<1:N> are the same combination. The refresh control circuit 30 may generate the refresh control signal SRCTR which is enabled, in the case where the bank addresses BA<1:4> are inputted by a predetermined number of times. In an embodiment, for example, the refresh control circuit 30 does not perform the smart refresh operation for a row hammering guarantee period, in the case where the smart refresh operation is performed once. In an embodiment, for example, the row hammering guarantee period is set as a period from an active operation time when data is stored in a bank by the row address until a logic level of the data stored in the bank is not changed.

The memory circuit 40 may include the first to fourth banks 41, 42, 43 and 44.

The first bank 41 may perform a smart refresh operation depending on a first bank address BA<1> and the first latch addresses LA1<1:N> in response to the refresh control signal SRCTR. The first bank 41 may be realized by a general memory circuit which includes a plurality of word lines and inputs and outputs (inputs/outputs) data through a word line selected depending on the first bank address BA<1> and the row addresses RA<1:N>.

The second bank 42 may perform a smart refresh operation depending on a second bank address BA<2> and the second latch addresses LA2<1:N> in response to the refresh control signal SRCTR. The second bank 42 may be realized by a general memory circuit which includes a plurality of word lines and inputs/outputs data through a word line selected depending on the second bank address BA<2> and the row addresses RA<1:N>.

The third bank 43 may perform a smart refresh operation depending on a third bank address BA<3> and the third latch addresses LA3<1:N> in response to the refresh control signal SRCTR. The third bank 43 may be realized by a general memory circuit which includes a plurality of word lines and inputs/outputs data through a word line selected depending on the third bank address BA<3> and the row addresses RA<1:N>.

The fourth bank 44 may perform a smart refresh operation depending on a fourth bank address BA<4> and the fourth latch addresses LA4<1:N> in response to the refresh control signal SRCTR. The fourth bank 44 may be realized by a general memory circuit which includes a plurality of word lines and inputs/outputs data through a word line selected depending on the fourth bank address BA<4> and the row addresses RA<1:N>.

Figure 2:
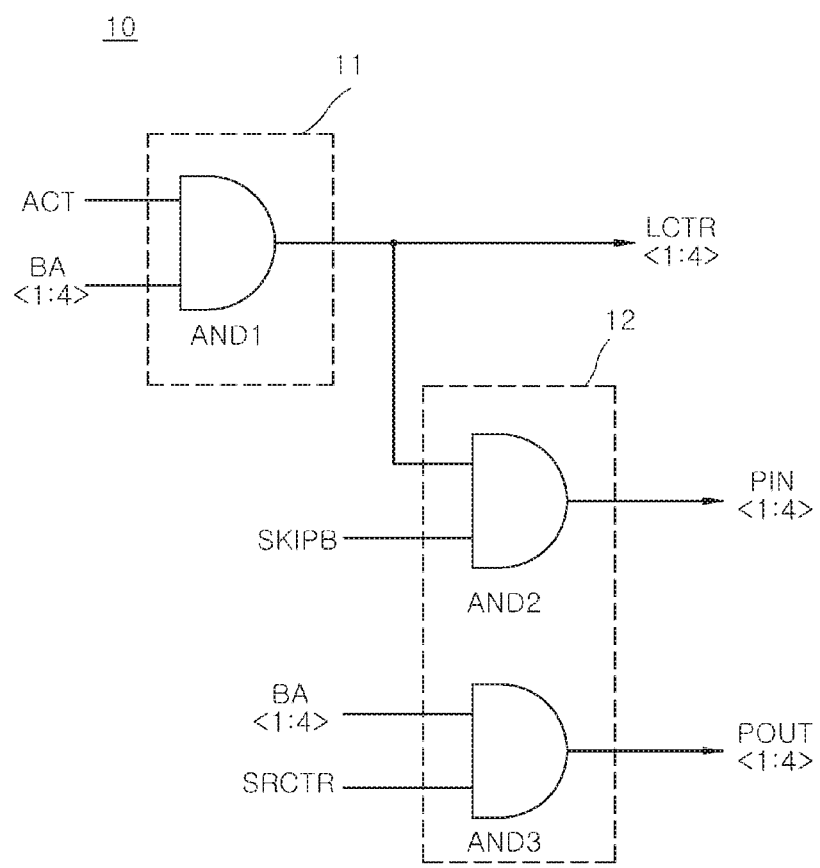
FIG. 2 is a circuit diagram illustrating a representation of an example of the configuration of the latch control circuit included in the semiconductor device illustrated in FIG. 1.

Referring to FIG. 2, the latch control circuit 10 may include a latch control signal generation circuit 11 and an input and output (input/output) control signal generation circuit 12.

The latch control signal generation circuit 11 may be realized by, for example but not limited to, an AND gate AND1. The latch control signal generation circuit 11 may generate the first to fourth latch control signals LCTR<1:4> in response to the active signal ACT and the bank addresses BA<1:4>. The latch control signal generation circuit 11 may generate the first to fourth latch control signals LCTR<1:4> in response to the bank addresses BA<1:4> in the case where the active signal ACT is enabled to a logic high level. The latch control signal generation circuit 11 may generate the first to fourth latch control signals LCTR<1:4> by performing an AND logic function on the active signal ACT and the bank addresses BA<1:4>. While the latch control signal generation circuit 11 is realized by one circuit, it is to be noted that the latch control signal generation circuit 11 may be realized by, for example but not limited to, four circuits corresponding to the number of bits of the bank addresses BA<1:4> to generate the first to fourth latch control signals LCTR<1:4>, respectively.

The input/output control signal generation circuit 12 may be realized by, for example but not limited to, AND gates AND2 and AND3. The input/output control signal generation circuit 12 may generate the first to fourth input control signals PIN<1:4> from the first to fourth latch control signals LCTR<1:4> in response to the skip signal SKIPB. The input/output control signal generation circuit 12 may generate the first to fourth input control signals PIN<1:4> in response to the first to fourth latch control signals LCTR<1:4> in the case where the skip signal SKIPB is disabled to the logic high level. The input/output control signal generation circuit 12 may generate the first to fourth input control signals PIN<1:4> by performing an AND logic function on the skip signal SKIPB and the first to fourth latch control signals LCTR<1:4>. The input/output control signal generation circuit 12 may generate the first to fourth output control signals POUT<1:4> from the first to fourth bank addresses BA<1:4> in response to the refresh control signal SRCTR. The input/output control signal generation circuit 12 may generate the first to fourth output control signals POUT<1:4> in response to the first to fourth bank addresses BA<1:4> in the case where the refresh control signal SRCTR is enabled to a logic high level. The input/output control signal generation circuit 12 may generate the first to fourth output control signals POUT<1:4> by performing an AND logic function on the refresh control signal SRCTR and the first to fourth bank addresses BA<1:4>.

Figure 3:
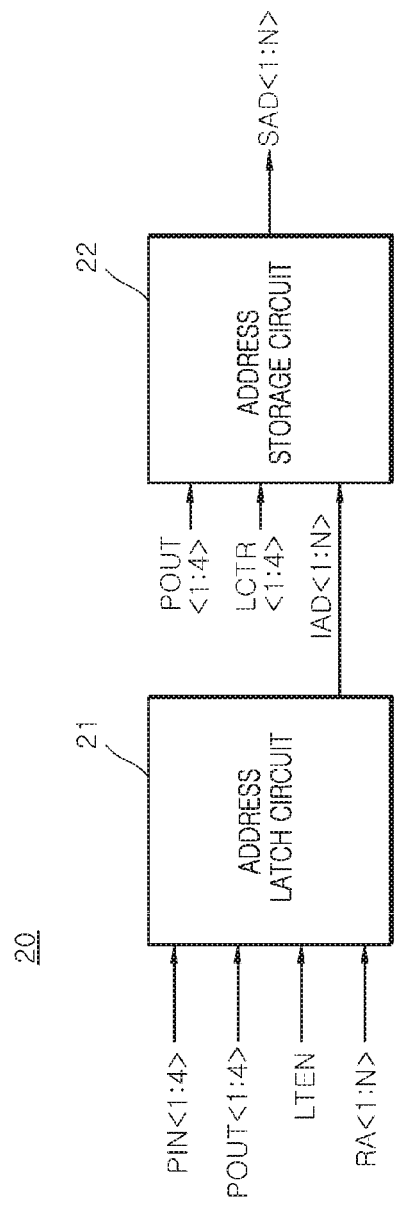
FIG. 3 is a block diagram illustrating a representation of an example of the configuration of the latch circuit included in the semiconductor device illustrated in FIG. 1.

Referring to FIG. 3, the latch circuit 20 may include an address latch circuit 21 and an address storage circuit 22.

The address latch circuit 21 may latch the row addresses RA<1:N> in response to the first to fourth input control signals PIN<1:4> and the latch enable signal LTEN. The address latch circuit 21 may output the latched row addresses RA<1:N> as the internal addresses IAD<1:N> in response to the first to fourth output control signals POUT<1:4>.

The address storage circuit 22 may latch the internal addresses IAD<1:N> in response to the first to fourth output control signals POUT<1:4>. The address storage circuit 22 may output the latched internal addresses IAD<1:N> as the storage addresses SAD<1:N> in response to the first to fourth latch control signals LCTR<1:4>.

Figure 4:
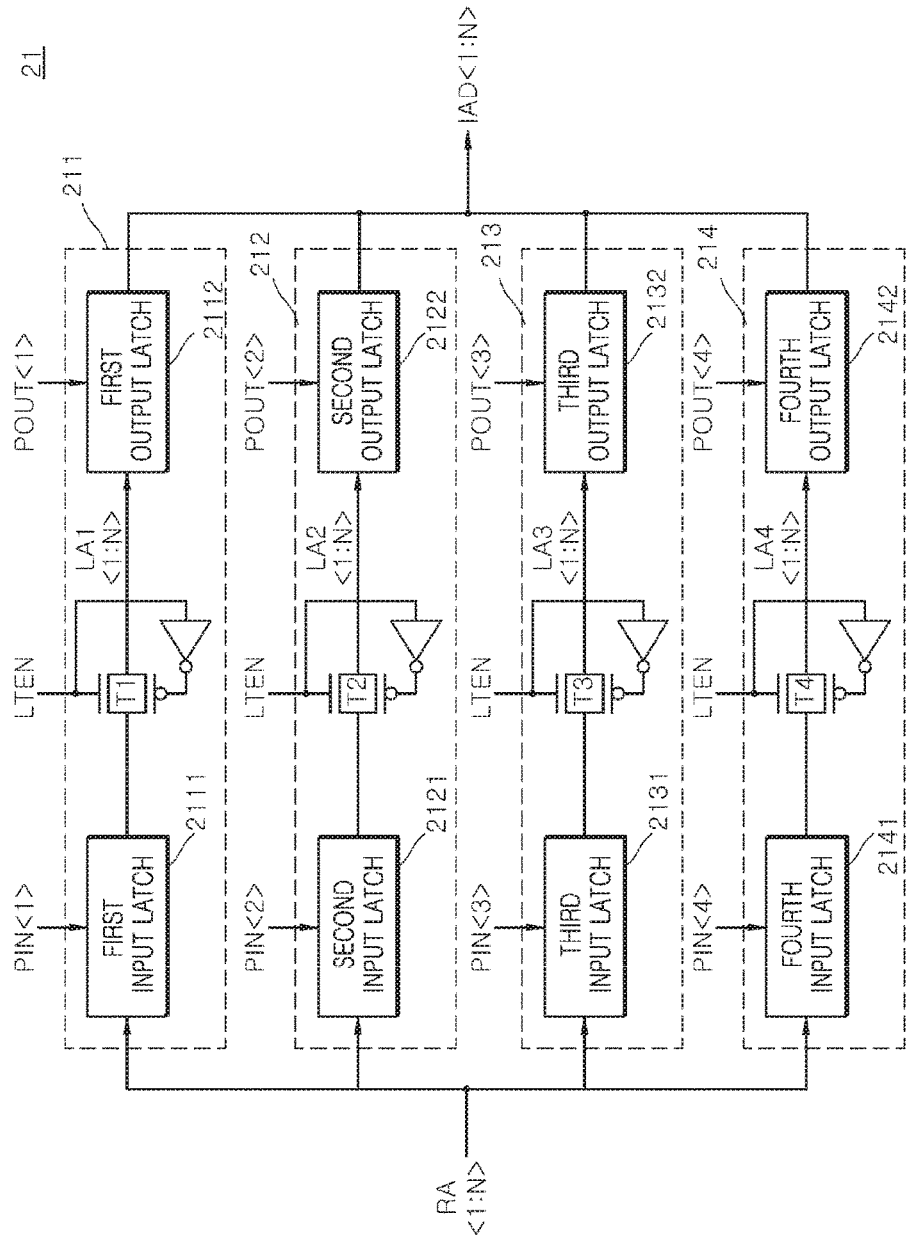
FIG. 4 is a block diagram illustrating a representation of an example of the configuration of the address latch circuit included in the latch circuit illustrated in FIG. 3.

Referring to FIG. 4, the address latch circuit 21 may include a first latch circuit 211, a second latch circuit 212, a third latch circuit 213, and a fourth latch circuit 214.

The first latch circuit 211 may include a first input latch 2111, a first switch T1, and a first output latch 2112.

The first input latch 2111 may latch the row addresses RA<1:N> in response to the first input control signal PIN<1>. The first input latch 2111 may latch the row addresses RA<1:N> in the case where the first input control signal PIN<1> is enabled to a logic high level.

The first switch T1 may be realized by, for example but not limited to, a transistor type transfer gate, and output the row addresses RA<1:N> latched by the first input latch 2111, as the first latch addresses LA1<1:N>, in the case where the latch enable signal LTEN is enabled to the logic high level.

The first output latch 2112 may latch the first latch addresses LA1<1:N> in response to the first output control signal POUT<1>, and output the latched first latch addresses LA1<1:N> as the internal addresses IAD<1:N>.

The second latch circuit 212 may include a second input latch 2121, a second switch T2, and a second output latch 2122.

The second input latch 2121 may latch the row addresses RA<1:N> in response to the second input control signal PIN<2>. The second input latch 2121 may latch the row addresses RA<1:N> in the case where the second input control signal PIN<2> is enabled to a logic high level.

The second switch T2 may be realized by, for example, a transistor type transfer gate, and output the row addresses RA<1:N> latched by the second input latch 2121, as the second latch addresses LA2<1:N>, in the case where the latch enable signal LTEN is enabled to the logic high level.

The second output latch 2122 may latch the second latch addresses LA2<1:N> in response to the second output control signal POUT<2>, and output the latched second latch addresses LA2<1:N> as the internal addresses IAD<1:N>.

The third latch circuit 213 may include a third input latch 2131, a third switch T3, and a third output latch 2132.

The third input latch 2131 may latch the row addresses RA<1:N> in response to the third input control signal PIN<3>. The third input latch 2131 may latch the row addresses RA<1:N> in the case where the third input control signal PIN<3> is enabled to a logic high level.

The third switch T3 may be realized by a transistor type transfer gate, and output the row addresses RA<1:N> latched by the third input latch 2131, as the third latch addresses LA3<1:N>, in the case where the latch enable signal LTEN is enabled to the logic high level.

The third output latch 2132 may latch the third latch addresses LA3<1:N> in response to the third output control signal POUT<3>, and output the latched third latch addresses LA3<1:N> as the internal addresses IAD<1:N>.

The fourth latch circuit 214 may include a fourth input latch 2141, a fourth switch T4, and a fourth output latch 2142.

The fourth input latch 2141 may latch the row addresses RA<1:N> in response to the fourth input control signal PIN<4>. The fourth input latch 2141 may latch the row addresses RA<1:N> in the case where the fourth input control signal PIN<4> is enabled to a logic high level.

The fourth switch T4 may be realized by a transistor type transfer gate, and output the row addresses RA<1:N> latched by the fourth input latch 2141, as the fourth latch addresses LA4<1:N>, in the case where the latch enable signal LTEN is enabled to the logic high level.

The fourth output latch 2142 may latch the fourth latch addresses LA4<1:N> in response to the fourth output control signal POUT<4>, and output the latched fourth latch addresses LA4<1:N> as the internal addresses IAD<1:N>.

Figure 5:
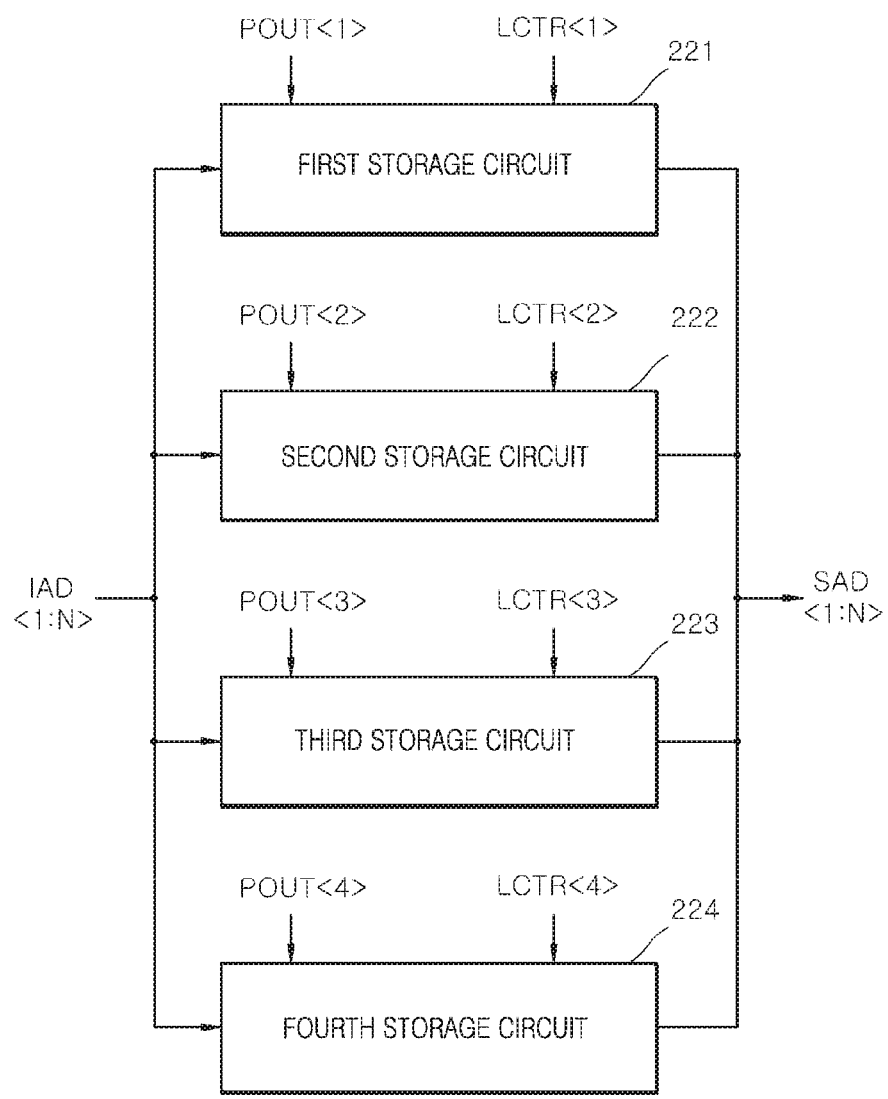
FIG. 5 is a block diagram illustrating a representation of an example of the configuration of the address storage circuit included in the latch circuit illustrated in FIG. 3.

Referring to FIG. 5, the address storage circuit 22 may include a first storage circuit 221, a second storage circuit 222, a third storage circuit 223, and a fourth storage circuit 224.

The first storage circuit 221 may latch the internal addresses IAD<1:N> in response to the first output control signal POUT<1>. The first storage circuit 221 may latch the internal addresses IAD<1:N> in the case where the first output control signal POUT<1> is enabled to a logic high level. The first storage circuit 221 may output the latched internal addresses IAD<1:N> as the storage addresses SAD<1:N> in response to the first latch control signal LCTR<1>. The first storage circuit 221 may output the latched internal addresses IAD<1:N> as the storage addresses SAD<1:N> in the case where the first latch control signal LCTR<1> is enabled to a logic high level.

The second storage circuit 222 may latch the internal addresses IAD<1:N> in response to the second output control signal POUT<2>. The second storage circuit 222 may latch the internal addresses IAD<1:N> in the case where the second output control signal POUT<2> is enabled to a logic high level. The second storage circuit 222 may output the latched internal addresses IAD<1:N> as the storage addresses SAD<1:N> in response to the second latch control signal LCTR<2>. The second storage circuit 222 may output the latched internal addresses IAD<1:N> as the storage addresses SAD<1:N> in the case where the second latch control signal LCTR<2> is enabled to a logic high level.

The third storage circuit 223 may latch the internal addresses IAD<1:N> in response to the third output control signal POUT<3>. The third storage circuit 223 may latch the internal addresses IAD<1:N> in the case where the third output control signal POUT<3> is enabled to a logic high level. The third storage circuit 223 may output the latched internal addresses IAD<1:N> as the storage addresses SAD<1:N> in response to the third latch control signal LCTR<3>. The third storage circuit 223 may output the latched internal addresses IAD<1:N> as the storage addresses SAD<1:N> in the case where the third latch control signal LCTR<3> is enabled to a logic high level.

The fourth storage circuit 224 may latch the internal addresses IAD<1:N> in response to the fourth output control signal POUT<4>. The fourth storage circuit 224 may latch the internal addresses IAD<1:N> in the case where the fourth output control signal POUT<4> is enabled to a logic high level. The fourth storage circuit 224 may output the latched internal addresses IAD<1:N> as the storage addresses SAD<1:N> in response to the fourth latch control signal LCTR<4>. The fourth storage circuit 224 may output the latched internal addresses IAD<1:N> as the storage addresses SAD<1:N> in the case where the fourth latch control signal LCTR<4> is enabled to a logic high level.

Figure 6:
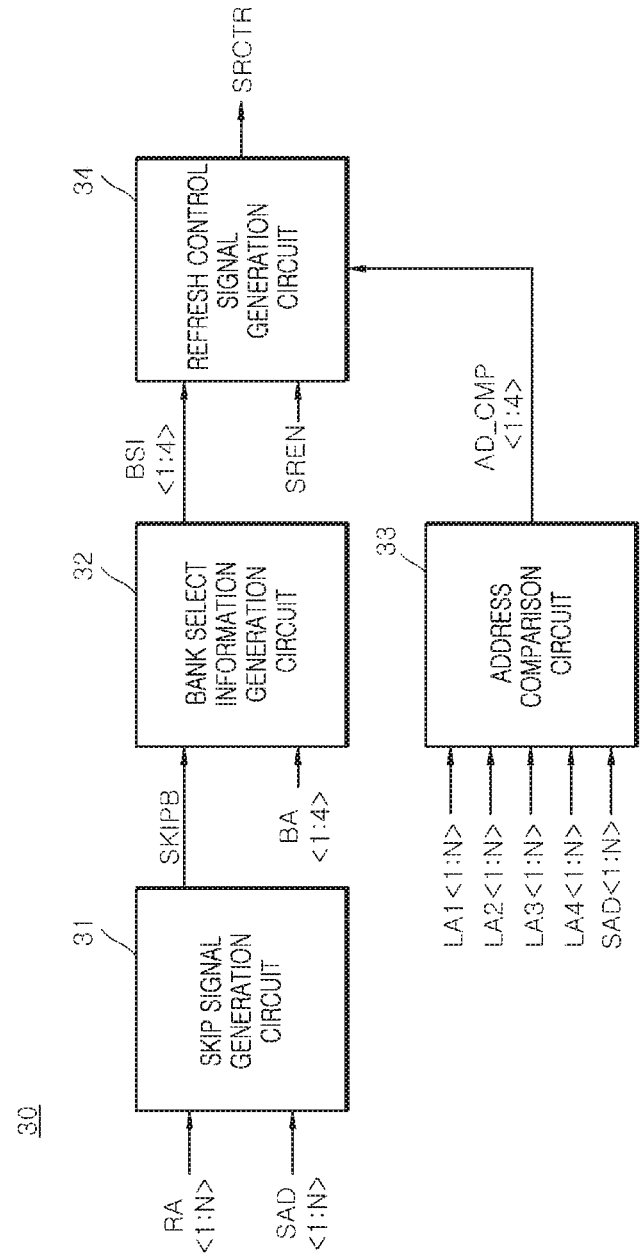
FIG. 6 is a block diagram illustrating a representation of an example of the configuration of the refresh control circuit included in the semiconductor device illustrated in FIG. 1.

Referring to FIG. 6, the refresh control circuit 30 may include a skip signal generation circuit 31, a bank select information generation circuit 32, an address comparison circuit 33, and a refresh control signal generation circuit 34.

The skip signal generation circuit 31 may compare the row addresses RA<1:N> and the storage addresses SAD<1:N>, and generate the skip signal SKIPB. The skip signal generation circuit 31 may generate the skip signal SKIPB which is enabled to a logic low level, in the case where the row addresses RA<1:N> and the storage addresses SAD<1:N> are the same combination. The skip signal generation circuit 31 may generate the skip signal SKIPB which is disabled to the logic high level, in the case where at least any ones among the bits of the row addresses RA<1:N> and the storage addresses SAD<1:N> are different logic levels.

The bank select information generation circuit 32 may generate bank select information BSI<1:4> which are enabled, in the case where the bank addresses BA<1:4> are inputted by the predetermined number of times in response to the skip signal SKIPB. The bank select information generation circuit 32 may generate the bank select information BSI<1> which is enabled in the case where the skip signal SKIPB is enabled to the logic low level and the bank address BA<1> is inputted by the predetermined number of times. The bank select information generation circuit 32 may generate the bank select information BSI<2> which is enabled in the case where the skip signal SKIPB is enabled to the logic low level and the bank address BA<2> is inputted by the predetermined number of times. The bank select information generation circuit 32 may generate the bank select information BSI<3> which is enabled in the case where the skip signal SKIPB is enabled to the logic low level and the bank address BA<3> is inputted by the predetermined number of times. The bank select information generation circuit 32 may generate the bank select information BSI<4> which is enabled in the case where the skip signal SKIPB is enabled to the logic low level and the bank address BA<4> is inputted by the predetermined number of times.

The address comparison circuit 33 may compare the first to fourth latch addresses LA1<1:N>, LA2<1:N>, LA3<1:N> and LA4<1:N> and the storage addresses SAD<1:N>, and generate first to fourth address comparison signals AD_CMP<1:4>. The address comparison circuit 33 may generate the first address comparison signal AD_CMP<1> which is enabled, in the case where the first latch addresses LA1<1:N> and the storage addresses SAD<1:N> are the same combination. The address comparison circuit 33 may generate the second address comparison signal AD_CMP<2> which is enabled, in the case where the second latch addresses LA2<1:N> and the storage addresses SAD<1:N> are the same combination. The address comparison circuit 33 may generate the third address comparison signal AD_CMP<3> which is enabled, in the case where the third latch addresses LA3<1:N> and the storage addresses SAD<1:N> are the same combination. The address comparison circuit 33 may generate the fourth address comparison signal AD_CMP<4> which is enabled, in the case where the fourth latch addresses LA4<1:N> and the storage addresses SAD<1:N> are the same combination.

The refresh control signal generation circuit 34 may generate the refresh control signal SRCTR which is enabled, in the case where any one of the bank select informations BSI<1:4> and the address comparison signals AD_CMP<1:4> is enabled in response to an enable signal SREN which is enabled in a smart refresh operation.

Figure 7:
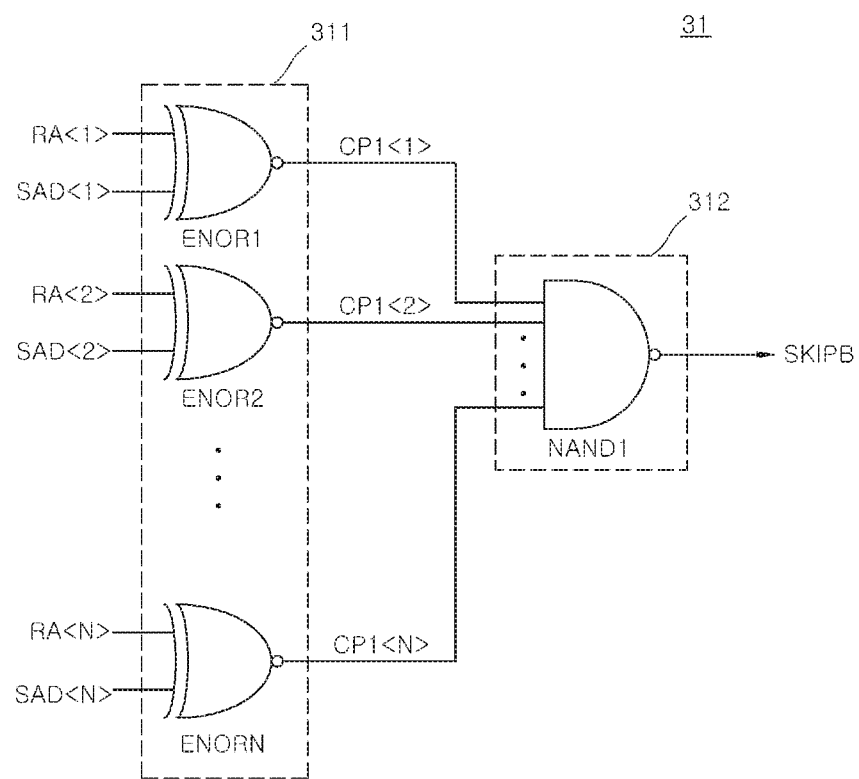
FIG. 7 is a circuit diagram illustrating a representation of an example of the configuration of the skip signal generation circuit included in the refresh control circuit illustrated in FIG. 6.

Referring to FIG. 7, the skip signal generation circuit 31 may include a first logic circuit 311 and a second logic circuit 312.

The first logic circuit 311 may be realized by, for example but not limited to, exclusive NOR gates ENOR1 to ENORN, and generate first comparison signals CP1<1:N> by comparing the row addresses RA<1:N> and the storage addresses SAD<1:N>. The first logic circuit 311 may generate the first comparison signals CP1<1:N> all of which are enabled to logic high levels, in the case where the bit combinations of the row addresses RA<1:N> and the storage addresses SAD<1:N> are the same.

The second logic circuit 312 may be realized by, for example but not limited to, a NAND gate NAND1, and generate the skip signal SKIPB which is enabled to the logic low level, in the case where all the first comparison signals CP1<1:N> are enabled to the logic high levels.

Figure 8:
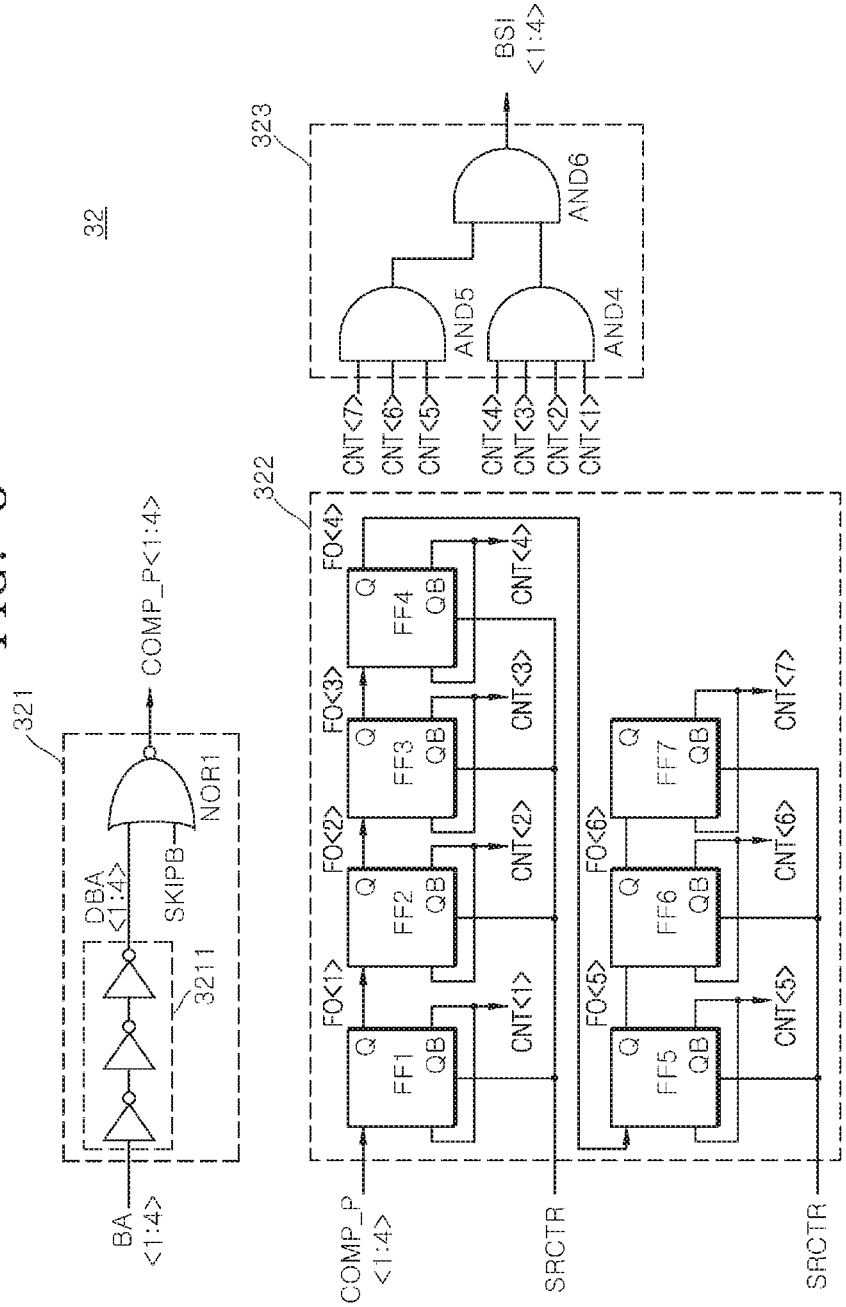
FIG. 8 is a circuit diagram illustrating a representation of an example of the configuration of the bank select information generation circuit included in the refresh control circuit illustrated in FIG. 6.

Referring to FIG. 8, the bank select information generation circuit 32 may include a pulse signal generation circuit 321, a counter 322, and a detection circuit 323.

The pulse signal generation circuit 321 may include, for example but not limited to, a delay circuit 3211 and a NOR gate NOR1. The delay circuit 3211 may invert and delay the bank addresses BA<1:4>, and generate inverted bank addresses DBA<1:4>. The NOR gate NOR1 may invert and buffer the inverted bank addresses DBA<1:4> in the case where the skip signal SKIPB is enabled to the logic low level, and generate pulse signals COMP_P<1:4>. The NOR gate NOR1 may generate the pulse signals COMP_P<1:4> by performing a NOR logic function on the skip signal SKIPB and the inverted bank addresses DBA<1:4>.

The pulse signal generation circuit 321 may generate the pulse signals COMP_P<1:4> by delaying the bank addresses BA<1:4> in response to the skip signal SKIPB.

The counter 322 may include, for example but not limited to, first to seventh flip-flops FF1, FF2, FF3, FF4, FF5, FF6 and FF7.

The first flip-flop FF1 may generate a first counting signal CNT<1> which level-transitions in response to the pulse signals COMP_P<1:4>. The first flip-flop FF1 may generate a first output signal FO<1> which is generated by inverting the first counting signal CNT<1>, in response to the pulse signals COMP_P<1:4>. The first flip-flop FF1 may be initialized in response to the refresh control signal SRCTR. An operation in which the first flip-flop FF1 is initialized means an operation in which the first counting signal CNT<1> is initialized to a logic low level in the case where the refresh control signal SRCTR is enabled.

The second flip-flop FF2 may generate a second counting signal CNT<2> which level-transitions in response to the first output signal FO<1>. The second flip-flop FF2 may generate a second output signal FO<2> which is generated by inverting the second counting signal CNT<2>, in response to the first output signal FO<1>. The second flip-flop FF2 may be initialized in response to the refresh control signal SRCTR. An operation in which the second flip-flop FF2 is initialized means an operation in which the second counting signal CNT<2> is initialized to a logic low level in the case where the refresh control signal SRCTR is enabled.

The third flip-flop FF3 may generate a third counting signal CNT<3> which level-transitions in response to the second output signal FO<2>. The third flip-flop FF3 may generate a third output signal FO<3> which is generated by inverting the third counting signal CNT<3>, in response to the second output signal FO<2>. The third flip-flop FF3 may be initialized in response to the refresh control signal SRCTR. An operation in which the third flip-flop FF3 is initialized means an operation in which the third counting signal CNT<3> is initialized to a logic low level in the case where the refresh control signal SRCTR is enabled.

The fourth flip-flop FF4 may generate a fourth counting signal CNT<4> which level-transitions in response to the third output signal FO<3>. The fourth flip-flop FF4 may generate a fourth output signal FO<4> which is generated by inverting the fourth counting signal CNT<4>, in response to the third output signal FO<3>. The fourth flip-flop FF4 may be initialized in response to the refresh control signal SRCTR. An operation in which the fourth flip-flop FF4 is initialized means an operation in which the fourth counting signal CNT<4> is initialized to a logic low level in the case where the refresh control signal SRCTR is enabled.

The fifth flip-flop FF5 may generate a fifth counting signal CNT<5> which level-transitions in response to the fourth output signal FO<4>. The fifth flip-flop FF5 may generate a fifth output signal FO<5> which is generated by inverting the fifth counting signal CNT<5>, in response to the fourth output signal FO<4>. The fifth flip-flop FF5 may be initialized in response to the refresh control signal SRCTR. An operation in which the fifth flip-flop FF5 is initialized means an operation in which the fifth counting signal CNT<5> is initialized to a logic low level in the case where the refresh control signal SRCTR is enabled.

The sixth flip-flop FF6 may generate a sixth counting signal CNT<6> which level-transitions in response to the fifth output signal FO<5>. The sixth flip-flop FF6 may generate a sixth output signal FO<6> which is generated by inverting the sixth counting signal CNT<6>, in response to the fifth output signal FO<5>. The sixth flip-flop FF6 may be initialized in response to the refresh control signal SRCTR. An operation in which the sixth flip-flop FF6 is initialized means an operation in which the sixth counting signal CNT<6> is initialized to a logic low level in the case where the refresh control signal SRCTR is enabled.

The seventh flip-flop FF7 may generate a seventh counting signal CNT<7> which level-transitions in response to the sixth output signal FO<6>. The seventh flip-flop FF7 may be initialized in response to the refresh control signal SRCTR. An operation in which the seventh flip-flop FF7 is initialized means an operation in which the seventh counting signal CNT<7> is initialized to a logic low level in the case where the refresh control signal SRCTR is enabled.

The counter 322 may generate the first to seventh counting signals CNT<1:7> which are counted in response to the pulse signals COMP_P<1:4>.

The detection circuit 323 may be realized by, for example but not limited to, AND gates AND4, AND5 and AND6, and generate the bank select information BSI<1:4> which are enabled in the case where the first to seventh counting signals CNT<1:7> are counted by the predetermined number of times. The detection circuit 323 may generate the bank select information BSI<1:4> which are enabled to logic high levels in the case where all the first to seventh counting signals CNT<1:7> are counted as logic high levels.

While the bank select information generation circuit 32 illustrated in FIG. 8 is illustrated as one circuit, it is to be noted that the bank select information generation circuit 32 may be realized by, for example but not limited to, four circuits which generate the bank select informations BSI<1:4>, respectively.

Figure 9:
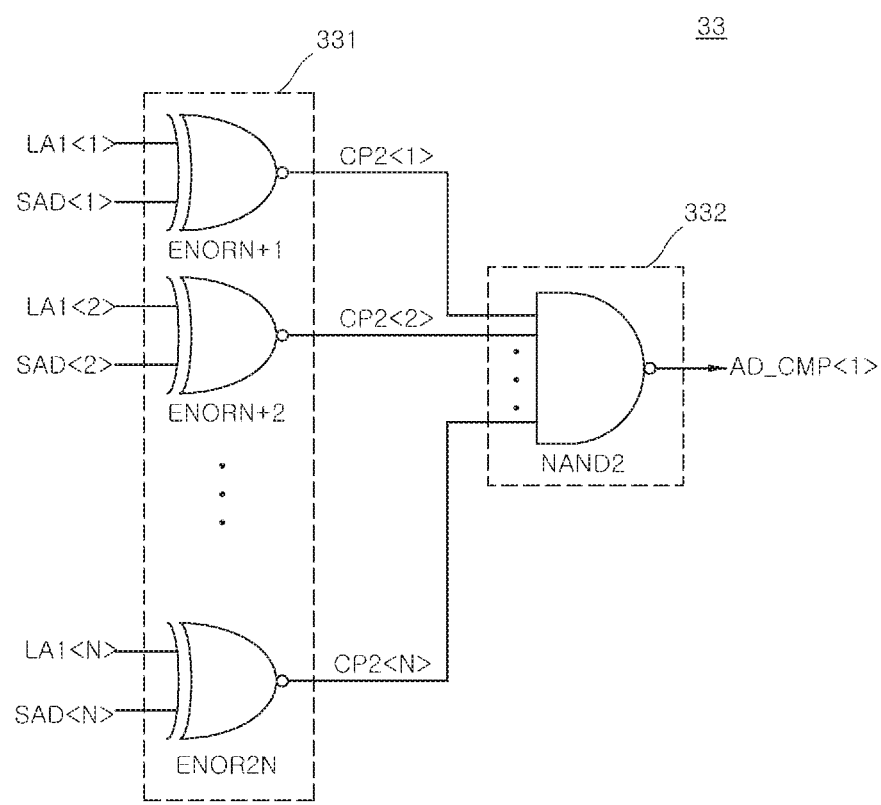
FIG. 9 is a circuit diagram illustrating a representation of an example of the configuration of the address comparison circuit included in the refresh control circuit illustrated in FIG. 6.

Referring to FIG. 9, the address comparison circuit 33 may include a third logic circuit 331 and a fourth logic circuit 332.

The third logic circuit 331 may be realized by, for example but not limited to, exclusive NOR gates ENORN+1 to ENOR2N, and generate second comparison signals CP2<1:N> by comparing the first latch addresses LA1<1:N> and the storage addresses SAD<1:N>. The third logic circuit 331 may generate the second comparison signals CP2<1:N> all of which are enabled to logic high levels, in the case where the bit combinations of the first latch addresses LA1<1:N> and the storage addresses SAD<1:N> are the same.

The fourth logic circuit 332 may be realized by, for example but not limited to, a NAND gate NAND2, and generate the address comparison signal AD_CMP<1> which is enabled to a logic low level, in the case where all the second comparison signals CP2<1:N> are enabled to the logic high levels. The fourth logic circuit 332 may generate the address comparison signal AD_CMP<1> by performing a NAND logic function on the second comparison signals CP2<1:N>.

While the address comparison circuit 33 illustrated in FIG. 9 is illustrated as one circuit, it is to be noted that the address comparison circuit 33 may be realized by, for example but not limited to, four circuits which generate the address comparison signals AD_CMP<1:4>, respectively.

Figure 10:
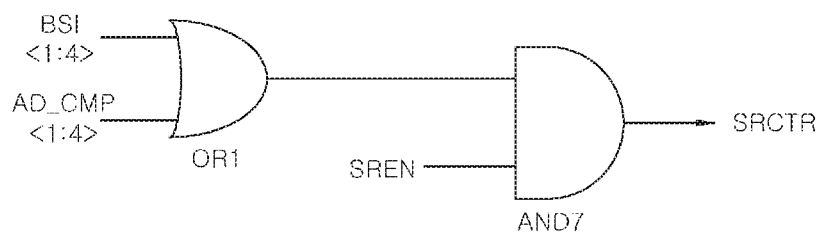
FIG. 10 is a circuit diagram illustrating a representation of an example of the configuration of the refresh control signal generation circuit included in the refresh control circuit illustrated in FIG. 6.

Referring to FIG. 10, the refresh control signal generation circuit 34 may be realized by, for example but not limited to, an OR gate OR1 and an AND gate AND7, and generate the refresh control signal SRCTR which is enabled in response to the enable signal SREN, in the case where any one of the bank select information BSI<1:4> and the address comparison signals AD_CMP<1:4> is enabled.

An operation of the semiconductor device in accordance with an embodiment will be described below with reference to FIG. 11, by being divided into an operation of omitting a smart refresh operation for the first bank 41 and an operation in which the same row addresses RA<1:N> for the first bank 41 are inputted successively.

First, the operation of omitting a smart refresh operation for the first bank 41 will be described below.

At a time T1, the first bank address BA<1> for selecting the first bank 41 (i.e. BK1), the active signal ACT and the enable signal SREN of a logic high level for entering a smart refresh operation are inputted.

The refresh control signal generation circuit 34 of the refresh control circuit 30 generates the refresh control signal SRCTR of the logic high level in response to the address comparison signal AD_CMP<1> of a logic high level.

The latch control circuit 10 generates the first latch control signal LCTR<1> of the logic high level in response to the active signal ACT and the first bank address BA<1>. The latch control circuit 10 generates the first output control signal POUT<1> of the logic high level in response to the refresh control signal SRCTR of the logic high level and the first bank address BA<1>.

The address latch circuit 21 of the latch circuit 20 outputs the first latch addresses LA1<1:N> as the internal addresses IAD<1:N> in response to the first output control signal POUT<1>. The first latch addresses LA1<1:N> are generated as an 'A' combination as the same combination as the row addresses RA<1:N> for which smart refresh has been performed. The address storage circuit 22 outputs the storage addresses SAD<1:N> of the 'A' combination in response to the first latch control signal LCTR<1>. The 'A' combination is set as a specific combination for selecting one among the plurality of word lines included in the first to fourth banks 41, 42, 43 and 44.

In the first bank 41 of the memory circuit 40, a smart refresh operation is performed depending on the first latch addresses LA1<1:N> of the 'A' combination in response to the refresh control signal SRCTR of the logic high level.

At a time T2, the first bank address BA<1> for selecting the first bank 41 and the row addresses RA<1:N> of a 'B' combination are inputted. The 'B' combination of the row addresses RA<1:N> is a combination for performing smart refresh.

The skip signal generation circuit 31 of the refresh control circuit 30 compares the row addresses RA<1:N> of the 'B' combination and the storage addresses SAD<1:N> of the 'A' combination, and generates the skip signal SKIPB which is disabled to the logic high level. The 'B' combination is set as a specific combination for selecting one among the plurality of word lines included in the first to fourth banks 41, 42, 43 and 44. Also, the 'B' combination is set as a combination for selecting a word line different from the 'A' combination.

At a time T3, the latch control circuit 10 generates the first input control signal PIN<1> of the logic high level in response to the skip signal SKIPB of the logic high level and the first latch control signal LCTR<1>.

The latch circuit 20 updates the first latch addresses LA1<1:N> of the 'B' combination for a smart refresh operation, in response to the first input control signal PIN<1>.

At a time T4, the first bank address BA<1> for selecting the first bank 41 and the row addresses RA<1:N> of the 'A' combination are inputted.

The skip signal generation circuit 31 of the refresh control circuit 30 compares the row addresses RA<1:N> of the 'A' combination and the storage addresses SAD<1:N> of the 'A' combination, and generates the skip signal SKIPB which is enabled to the logic low level.

The latch control circuit 10 does not generate the first input control signal PIN<1> in response to the skip signal SKIPB of the logic low level and the first latch control signal LCTR<1>. The latch control circuit 10 does not generate the first output control signal POUT<1> in response to the refresh control signal SRCTR of a logic low level and the first bank address BA<1>.

The address latch circuit 21 of the latch circuit 20 does not output the first latch addresses LA1<1:N> as the internal addresses IAD<1:N> in response to the first output control signal POUT<1>. The first latch addresses LA1<1:N> are generated as the 'B' combination the same as the row addresses RA<1:N> for which smart refresh has been performed. The address latch circuit 21 does not update the row addresses RA<1:N> of the 'A' combination with the first latch addresses LA1<1:N> in response to the first input control signal PIN<1> of a logic low level. The address storage circuit 22 outputs the storage addresses SAD<1:N> of the 'A' combination in response to the first latch control signal LCTR<1>.

In the first bank 41 of the memory circuit 40, a smart refresh operation is omitted since the first latch addresses LA1<1:N> of the 'A' combination are not inputted.

Next, the operation in which the same row addresses RA<1:N> for the first bank 41 are inputted successively will be described below.

At a time T5, the first bank address BA<1> for selecting the first bank 41, the active signal ACT and the enable signal SREN of the logic high level for entering a smart refresh operation are inputted. Also, the first bank address BA<1> for selecting the first bank 41 and the row addresses RA<1:N> of the 'B' combination are inputted.

The refresh control signal generation circuit 34 of the refresh control circuit 30 generates the refresh control signal SRCTR of the logic high level in response to the address comparison signal AD_CMP<1> of the logic high level.

The latch control circuit 10 generates the first latch control signal LCTR<1> of the logic high level in response to the active signal ACT and the first bank address BA<1>. The latch control circuit 10 generates the first output control signal POUT<1> of the logic high level in response to the refresh control signal SRCTR of the logic high level and the first bank address BA<1>.

The skip signal generation circuit 31 of the refresh control circuit 30 compares the row addresses RA<1:N> of the 'B' combination and the storage addresses SAD<1:N> of the 'B' combination, and generates the skip signal SKIPB which is enabled to the logic low level.

The address latch circuit 21 of the latch circuit 20 outputs the first latch addresses LA1<1:N> as the internal addresses IAD<1:N> in response to the first output control signal POUT<1> of the logic high level. The address storage circuit 22 outputs the storage addresses SAD<1:N> of the 'B' combination in response to the first latch control signal LCTR<1>. Here, the first latch addresses LA1<1:N> are generated as a 'C' combination. The 'C' combination of the first latch addresses LA1<1:N> is a combination for selecting a word line for which smart refresh has been performed. The 'C' combination is set as a specific combination for selecting one among the plurality of word lines included in the first to fourth banks 41, 42, 43 and 44. Also, the 'C' combination is set as a combination for selecting a word line different from the 'A' combination and the 'B' combination.

The counter 322 of the refresh control circuit 30 generates the counting signals CNT<1:7> which are initialized in response to the refresh control signal SRCTR of the logic high level. The counting signals CNT<1:7> which are initialized mean '0' illustrated in FIG. 11 as all the bits of the counting signals CNT<1:7> are generated as the logic low levels.

Figure 11:
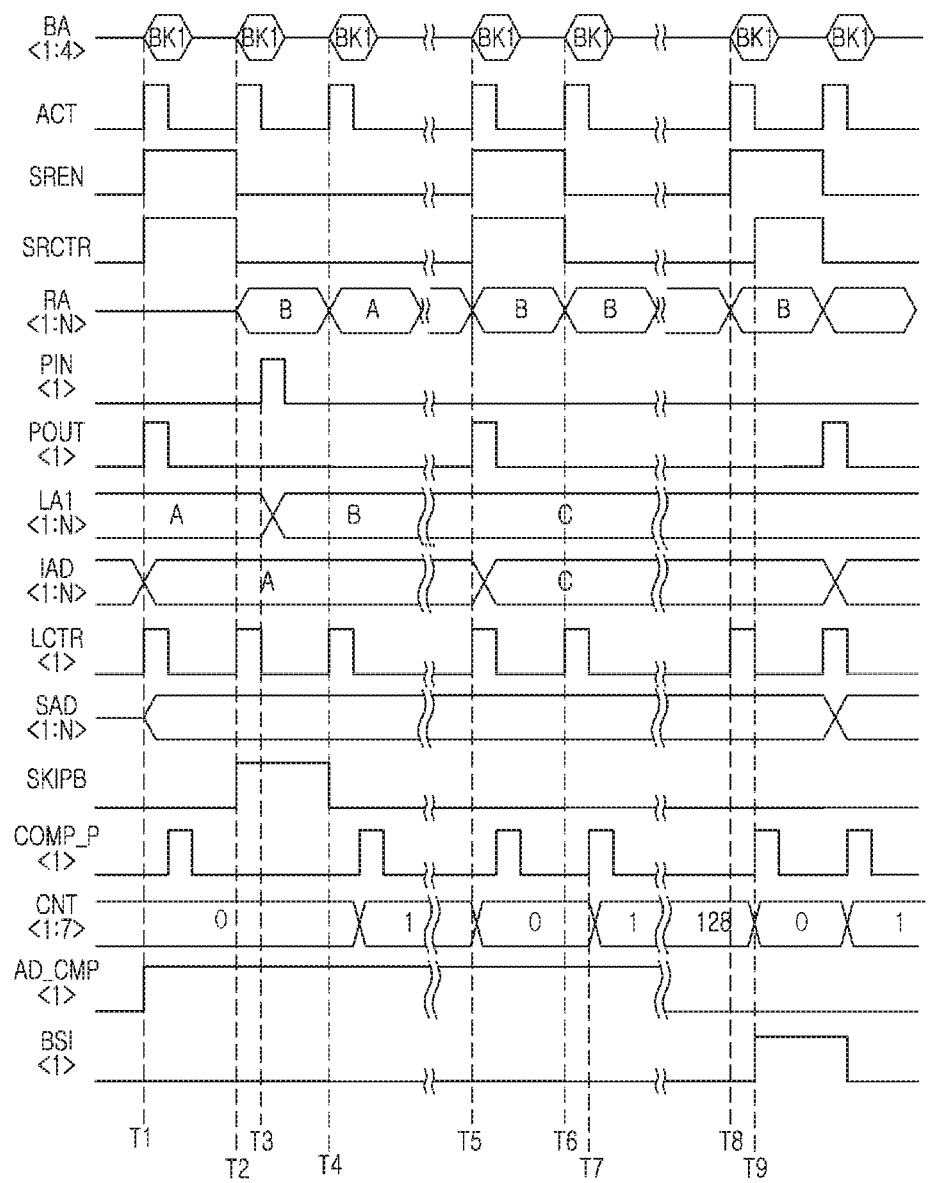
FIG. 11 is a representation of an example of a timing diagram to assist in the explanation of the operation of the semiconductor device in accordance with the embodiments.

'0' illustrated in FIG. 11 means a case where all the bits of the counting signals CNT<1:7> are initialized to the logic low levels. '1' illustrated in FIG. 11 means a case where the counting signals CNT<1:7> are counted 1 time and thus only the counting signal CNT<1> among the counting signals CNT<1:7> is counted as the logic high level. '128' illustrated in FIG. 11 means a case where the counting signals CNT<1:7> are counted 128 times and thus all the bits of the counting signals CNT<1:7> are generated as the logic high levels.

In the first bank 41 of the memory circuit 40, a smart refresh operation is performed depending on the first latch addresses LA1<1:N> of the 'C' combination in response to the refresh control signal SRCTR of the logic high level.

At a time T6, the first bank address BA<1> for selecting the first bank 41, the active signal ACT and the enable signal SREN of a logic low level are inputted. Also, the first bank address BA<1> for selecting the first bank 41 and the row addresses RA<1:N> of the 'B' combination are inputted.

The refresh control signal generation circuit 34 of the refresh control circuit 30 generates the refresh control signal SRCTR of the logic low level in response to the enable signal SREN of the logic low level.

The latch control circuit 10 generates the first latch control signal LCTR<1> of the logic high level in response to the active signal ACT and the first bank address BA<1>. The latch control circuit 10 does not generate the first output control signal POUT<1> in response to the refresh control signal SRCTR of the logic low level.

The skip signal generation circuit 31 of the refresh control circuit 30 compares the row addresses RA<1:N> of the 'B' combination and the storage addresses SAD<1:N> of the 'B' combination, and generates the skip signal SKIPB which is enabled to the logic low level.

The address latch circuit 21 of the latch circuit 20 does not output the first latch addresses LA1<1:N> as the internal addresses IAD<1:N> in response to the first output control signal POUT<1> of a logic low level. The first latch addresses LA1<1:N> are generated as the 'C' combination the same as the row addresses RA<1:N> for which smart refresh has been performed. The address storage circuit 22 outputs the storage addresses SAD<1:N> of the 'C' combination in response to the first latch control signal LCTR<1>.

At a time T7, the pulse signal generation circuit 321 of the refresh control circuit 30 generates the pulse signal COMP_P<1> by delaying the bank address BA<1> in response to the skip signal SKIPB of the logic low level. The counter 322 generates the counting signals CNT<1:7> which are counted in response to the pulse signal COMP_P<1> of a logic high level. The counting signals CNT<1:7> are counted 1 time and mean '1' illustrated in FIG. 11.

Thereafter, the refresh control circuit 30 counts the counting signals CNT<1:7> each time the bank address BA<1> is inputted.

At a time T8, the first bank address BA<1> for selecting the first bank 41, the active signal ACT and the enable signal SREN of the logic high level are inputted. Also, the first bank address BA<1> for selecting the first bank 41 and the row addresses RA<1:N> of the 'B' combination are inputted.

The refresh control signal generation circuit 34 of the refresh control circuit 30 generates the refresh control signal SRCTR of the logic low level in response to the enable signal SREN of the logic high level, the first address comparison signal AD_CMP<1> of the logic low level and the bank select information BSI<1> of a logic low level.

The latch control circuit 10 generates the first latch control signal LCTR<1> of the logic high level in response to the active signal ACT and the first bank address BA<1>. The latch control circuit 10 does not generate the first output control signal POUT<1> in response to the refresh control signal SRCTR of the logic low level.

The skip signal generation circuit 31 of the refresh control circuit 30 compares the row addresses RA<1:N> of the 'B' combination and the storage addresses SAD<1:N> of the 'B' combination, and generates the skip signal SKIPB which is enabled to the logic low level.

The address latch circuit 21 of the latch circuit 20 does not output the first latch addresses LA1<1:N> as the internal addresses IAD<1:N> in response to the first output control signal POUT<1> of the logic low level. The first latch addresses LA1<1:N> are generated as the 'C' combination the same as the row addresses RA<1:N> for which smart refresh has been performed. The address storage circuit 22 outputs the storage addresses SAD<1:N> of the 'C' combination in response to the first latch control signal LCTR<1>.

The pulse signal generation circuit 321 of the refresh control circuit 30 generates the pulse signal COMP_P<1> by delaying the bank address BA<1> in response to the skip signal SKIPB of the logic low level.

The counter 322 generates the counting signals CNT<1:7> which are counted in response to the pulse signal COMP_P<1> of the logic high level. At this time, the counting signals CNT<1:7> are counted 128 times and are counted by the predetermined number of times. In the case where the counting signals CNT<1:7> are counted by the predetermined number of times, all the bits of the counting signals CNT<1:7> are generated as the logic high levels.

At a time T9, the detection circuit 323 generates the bank select information BSI<1> which is enabled to the logic high level, as all the bits of the counting signals CNT<1:7> are counted as the logic high levels.

The refresh control signal generation circuit 34 of the refresh control circuit 30 generates the refresh control signal SRCTR of the logic high level in response to the enable signal SREN of the logic high level and the bank select information BSI<1> of the logic high level.

In the first bank 41 of the memory circuit 40, a smart refresh operation is performed depending on the first latch addresses LA1<1:N> of the 'B' combination in response to the refresh control signal SRCTR of the logic high level.

As is apparent from the above descriptions, in the semiconductor device according to an embodiment, by storing a row address for which smart refresh has been performed and omitting a smart refresh operation in the case where the stored row address and a row address inputted from an exterior are the same combination, a current consumption amount may be reduced.

Figure 12:
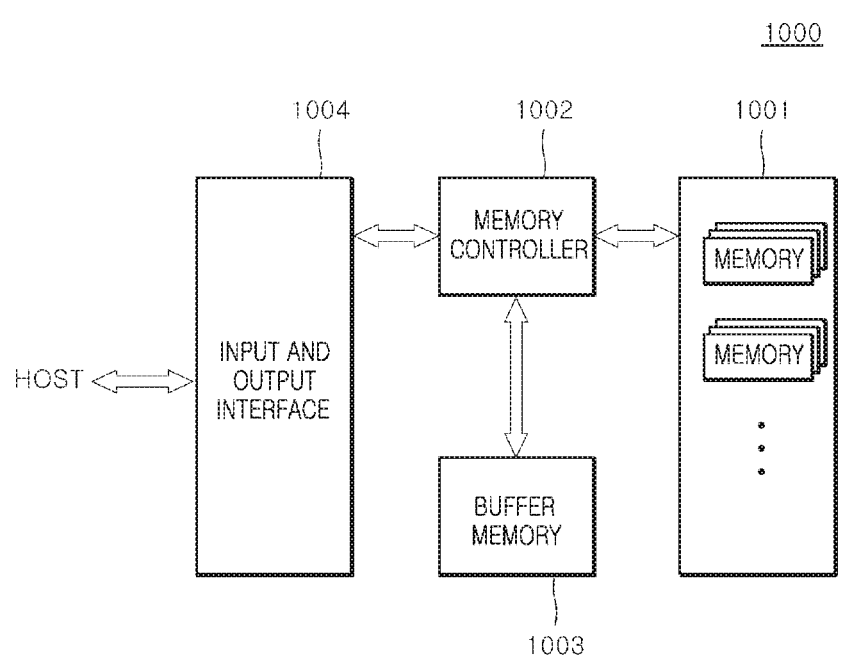
FIG. 12 is a diagram illustrating a representation of an example of the configuration of an electronic system to which the semiconductor device illustrated in FIGS. 1 to 11 is applied.

The semiconductor devices described above with reference to FIGS. 1 to 11 may be applied to an electronic system which includes, for example but not limited to, a memory system, a graphic system, a computing system or a mobile system. For example, referring to FIG. 12, an electronic system 1000 in accordance with an embodiment may include a data storage 1001, a memory controller 1002, a buffer memory 1003, and an input and output (input/output) interface 1004.

The data storage 1001 stores data applied from the memory controller 1002, and reads out stored data and outputs the read-out data to the memory controller 1002, according to control signals from the memory controller 1002. The data storage 1001 may include the semiconductor devices illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 12, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor devices and the semiconductor systems described herein should not be limited based on the described embodiments.

What is claimed is:

1. A semiconductor device comprising:
   a latch circuit configured for storing a row address including information on a position where a smart refresh operation has been performed, as a storage address;
   a refresh control circuit configured for controlling, depending on a result of comparing a row address inputted from an exterior and the storage address, a smart refresh operation to be performed for the row address, and omitting the smart refresh operation based on the row address and the storage address being the same combination, and
   wherein the refresh control circuit performs the smart refresh operation when same bank addresses are inputted by a predetermined number of times.

2. The semiconductor device according to claim 1, wherein the refresh control circuit does not perform the smart refresh operation for a row hammering guarantee period, based on the smart refresh operation being performed once.

3. The semiconductor device according to claim 2, wherein the row hammering guarantee period is set as a period from an active operation time when data is stored in a bank with the use of the row address until a logic level of the data stored in the bank is not changed.

4. The semiconductor device according to claim 1, wherein the latch circuit comprises:
   an address latch circuit configured for latching the row address based on an input control signal and a latch enable signal, and outputting the latched row address as an internal address based on an output control signal; and
   an address storage circuit configured for latching the internal address based on the output control signal, and outputting the latched internal address as the storage address based on a latch control signal.

5. The semiconductor device according to claim 4,
wherein the input control signal includes a first input control signal and a second input control signal, the output control signal includes a first output control signal and a second output control signal, and the address latch circuit comprises:
a first latch circuit configured for latching the row address based on the first input control signal, and outputting the row address as the internal address based on the latch enable signal and the first output control signal; and
a second latch circuit configured for latching the row address based on the second input control signal, and outputting the row address as the internal address based on the latch enable signal and the second output control signal.

6. The semiconductor device according to claim 5, wherein the first latch circuit comprises:
a first input latch configured for latching the row address based on the first input control signal;
a first switch configured for outputting the latched row address as a first latch address based on the latch enable signal; and
a first output latch configured for outputting the first latch address as the internal address based on the first output control signal.

7. The semiconductor device according to claim 5, wherein the second latch circuit comprises:
a second input latch configured for latching the row address based on the second input control signal;
a second switch configured for outputting the latched row address as a second latch address based on the latch enable signal; and
a second output latch configured for outputting the second latch address as the internal address based on the second output control signal.

8. The semiconductor device according to claim 4,
wherein the output control signal includes a first output control signal and a second output control signal, the latch control signal includes a first latch control signal and a second latch control signal, and the address storage circuit comprises:
a first storage circuit configured for latching the internal address based on the first output control signal, and outputting the latched internal address as the storage address based on the first latch control signal; and
a second storage circuit configured for latching the internal address based on the second output control signal, and outputting the latched internal address as the storage address based on the second latch control signal.

9. The semiconductor device according to claim 1, wherein the refresh control circuit comprises:
a skip signal generation circuit configured for generating a skip signal by comparing the row address and the storage address;
a bank select information generation circuit configured for generating bank select information which is enabled based on a bank address being input by a predetermined number of times, based on the skip signal;
an address comparison circuit configured for generating an address comparison signal by comparing a latch address and the storage address; and
a refresh control signal generation circuit configured for generating a refresh control signal which is enabled when any one of the bank select information and the address comparison signal is enabled, based on an enable signal which is enabled in the smart refresh operation.

10. The semiconductor device according to claim 9, wherein the skip signal is enabled based on a combination of the row address and a combination of the storage address being the same combination.

11. The semiconductor device according to claim 9, wherein the bank select information generation circuit comprises:
a pulse signal generation circuit configured for generating a pulse signal by delaying the bank address based on the skip signal;
a counter configured for generating a counting signal which is counted based on the pulse signal; and
a detection circuit configured for generating the bank select information which is enabled based on the counting signal being counted by the predetermined number of times.

12. A semiconductor device comprising:
a latch control circuit configured for generating an input control signal, an output control signal and a latch control signal which are selectively enabled depending on a bank address, based on an active signal;
a latch circuit configured for storing a row address as a storage address based on the input control signal, the output control signal and the latch control signal; and
a refresh control circuit configured for controlling, depending on a result of comparing a row address inputted from an exterior and the storage address, a smart refresh operation to be performed for the row address, and omitting the smart refresh operation based on the row address and the storage address being the same combination.

13. The semiconductor device according to claim 12, wherein the refresh control circuit does not perform the smart refresh operation for a row hammering guarantee period, based on the smart refresh operation being performed once.

14. The semiconductor device according to claim 13, wherein the row hammering guarantee period is set as a period from an active operation time when data is stored in a bank by the row address until a logic level of the data stored in the bank is not changed.

15. The semiconductor device according to claim 12, wherein the latch control circuit comprises:
a latch control signal generation circuit configured for generating a first latch control signal which is enabled based on a first bank address and a second latch control signal which is enabled based on the second bank address, based on the active signal being enabled; and
an input and output (input/output) control signal generation circuit configured for generating first and second input control signals from the first and second latch control signals based on a skip signal, and generating first and second output control signals from the first and second bank addresses based on a refresh control signal.

16. The semiconductor device according to claim 12, wherein the latch circuit comprises:
an address latch circuit configured for latching the row address based on an input control signal and a latch enable signal, and outputting the latched row address as an internal address based on an output control signal; and
an address storage circuit configured for latching the internal address based on the output control signal, and outputting the latched internal address as the storage address based on a latch control signal.

17. The semiconductor device according to claim 16, wherein the input control signal includes a first input control signal and a second input control signal, the output control signal including a first output control signal and a second output control signal, and the address latch circuit comprises:
a first latch circuit configured for latching the row address based on the first input control signal, and outputting the row address as the internal address based on the latch enable signal and the first output control signal; and
a second latch circuit configured for latching the row address based on the second input control signal, and outputting the row address as the internal address based on the latch enable signal and the second output control signal.

18. The semiconductor device according to claim 17, wherein the first latch circuit comprises:
a first input latch configured for latching the row address based on the first input control signal;
a first switch configured for outputting the latched row address as a first latch address based on the latch enable signal; and
a first output latch configured for outputting the first latch address as the internal address based on the first output control signal.

19. The semiconductor device according to claim 17, wherein the second latch circuit comprises:
a second input latch configured for latching the row address based on the second input control signal;
a second switch configured for outputting the latched row address as a second latch address based on the latch enable signal; and
a second output latch configured for outputting the second latch address as the internal address based on the second output control signal.

20. The semiconductor device according to claim 16, wherein the output control signal includes a first output control signal and a second output control signal, the latch control signal including a first latch control signal and a second latch control signal, and the address storage circuit comprises:
a first storage circuit configured for latching the internal address based on the first output control signal, and outputting the latched internal address as the storage address based on the first latch control signal; and
a second storage circuit configured for latching the internal address based on the second output control signal, and outputting the latched internal address as the storage address based on the second latch control signal.

21. The semiconductor device according to claim 12, wherein the refresh control circuit comprises:
a skip signal generation circuit configured for generating a skip signal by comparing the row address and the storage address;
a bank select information generation circuit configured for generating bank select information which is enabled based on a bank address being inputted by a predetermined number of times, based on the skip signal;
an address comparison circuit configured for generating an address comparison signal by comparing a latch address and the storage address; and
a refresh control signal generation circuit configured for generating a refresh control signal which is enabled when any one of the bank select information and the address comparison signal is enabled, based on an enable signal which is enabled in the smart refresh operation.

22. The semiconductor device according to claim 21, wherein the skip signal is enabled based on a combination of the row address and a combination of the storage address being the same combination.

23. The semiconductor device according to claim 21, wherein the bank select information generation circuit comprises:
a pulse signal generation circuit configured for generating a pulse signal by delaying the bank address based on the skip signal;
a counter configured for generating a counting signal which is counted based on the pulse signal; and
a detection circuit configured for generating the bank select information which is enabled based on the counting signal being counted by the predetermined number of times.

* * * * *